United States Patent [19]
Park et al.

[11] Patent Number: 5,504,768
[45] Date of Patent: Apr. 2, 1996

[54] SEMICONDUCTOR LASER DEVICE AND METHOD FOR MANUFACTURING THE SAME

[75] Inventors: Chan-Yong Park; Ji-Beom Yoo; Kyung-Hyun Park; Hong-Man Kim; Dong-Hoon Jang; Jung-Kee Lee, all of Daejeon, Rep. of Korea

[73] Assignees: Electronics and Telecommunications Research Institute, Daejeon-shi; Korea Telecommunication Authority, Seoul, both of Rep. of Korea

[21] Appl. No.: 161,422

[22] Filed: Dec. 6, 1993

[30] Foreign Application Priority Data

Dec. 22, 1992 [KR] Rep. of Korea ............... 92-25018

[51] Int. Cl.$^6$ .................. H01S 3/18; H01L 21/31
[52] U.S. Cl. .................................. 372/46; 437/129
[58] Field of Search .................. 372/46, 96, 43; 437/129

[56] References Cited

U.S. PATENT DOCUMENTS

| | | | |
|---|---|---|---|
| 4,647,953 | 3/1987 | Okajima et al. | 372/46 |
| 4,694,460 | 9/1987 | Hayakawa et al. | 372/45 |
| 5,189,679 | 2/1993 | Derry et al. | 372/46 |
| 5,222,091 | 6/1993 | Holmstrom et al. | 372/46 |

FOREIGN PATENT DOCUMENTS 404245492  9/1992  Japan ........................ 372/43

Primary Examiner—Rodney B. Bovernick
Assistant Examiner—Robert McNutt
Attorney, Agent, or Firm—Larson and Taylor

[57] ABSTRACT

A method for manufacturing the semiconductor laser device comprising the steps of sequentially forming an active layer, a photo-waveguide layer, a cladding layer, and an ohmic contact layer on an upper surface of an InP substrate; forming a first patterned dielectric layer on the ohmic contact layer; depositing a patterned photoresist on the ohmic contact layer to define a p- electrode stripe layer; forming the p- electrode stripe layer only on a part of the ohmic contact layer; performing an annealing process; etching back the layers until the photo-waveguide layer is exposed, using the first patterned dielectric layer and the p-electrode stripe layer as an etching mask, to form a ridge; depositing a second dielectric layer on the substrate formed thus; selectively removing the second dielectric layer to form a contact hole on the p- electrode stripe layer; coating a bonding pad metal layer on the second dielectric layer and in the contact hole; and coating an n- electrode metal layer on bottom surface of the substrate. Since ohmic contact resistance is lowered, thermal generation and threshold current of oscillation are decreased. As a result, operating characteristics of the laser device can be largely improved.

6 Claims, 5 Drawing Sheets

SEMICONDUCTOR LASER DEVICE AND METHOD FOR MANUFACTURING THE SAME

BACKGROUND OF THE INVENTION

1. Field of the Invention

The present invention relates to a semiconductor laser device of RWG (ridge waveguide) type and a method for manufacturing the same.

2. Description of the Prior Art

Typical one of conventional semiconductor laser devices has the construction which is shown in FIG. 1. In FIG. 1, the construction thereof is shown in which an epitaxial layer having several thin films is formed on the InP substrate 11. The epitaxial layer is formed by following steps. First, on an n- InP substrate 11 is formed an InGaAsP film 12 which is approximately 0.2 μm in thickness and about 0.95 eV in bandgap composition to form an active film. Next, on the active film 12 is formed a p- InGaAsP film 13 which is approximately 0.2 μm in thickness and about 1.12 eV in bandgap composition to form a photo-waveguide film, and on the photo-waveguide film 13 is formed a p- InP film 14 which is approximately 1.5 to 2 μm in thickness to form a cladding film. Subsequently, on the cladding film 14 is formed a P$^+$InGaAs film 15 which is approximately 0.3 to 0.5 μm in thickness to form an ohmic contact film. These films 12, 13, 14, and 15 are formed by an LPE (liquid phase epitaxy) or an MOCVD (metal-organic CVD).

In addition, an etching process is performed using a ridge forming mask to form a ridge of r μm in width. Then, a dielectric layer 16 is deposited on the substrate in which the ridge is formed thus and patterning is performed to form a contact hole of W μm in width, where r is greater than W. A patterned dielectric layer and a patterned photoresist may be used as the ridge forming mask. Also, a p- electrode metal layer 17 is formed on the dielectric layer 16 and in the contact hole, and an annealing is performed. Finally, in order to make cleaving in the laser easily, the InP substrate 11 is ground in the bottom surface to have 100 μm in thickness, and then an n- electrode metal layer 19 is coated on the ground bottom surface.

In the conventional semiconductor laser device which is manufactured by the above described method, since the contact hole has to be formed on upper surface of the ridge, the width W of the contact hole has to be less than the width r of the ridge. Therefore, the ridge has to be relatively largely formed.

For example, when the width W of the contact hole is formed to the extent of 3 μm, the ridge has to be formed having the range of 4 to 5 μm in thickness with respect to align tolerance. This is because mask alignment for forming the contact hole is impossible when the width of the ridge is less than the range. If the width W of the contact hole is formed further large, the ridge also has to formed large in size. As a result, in the case that the laser device formed thus is applied to a communication system, it is particularly effected on high-speed operation in such an optical fiber communication. This technique is disclosed by U.S. Pat. No. 4,888,784.

Also, in the semiconductor laser device as is shown in FIG. 1, threshold current of oscillation thereof as one of principal characteristics of the laser device generally is increased up to 30 mA or more. As a result the characteristic of the laser device is lowered.

If the ridge therein is formed having width of 3 μm or less so as to prevent the characteristic from being lowered, there arises a problem that ohmic contact resistance is largely increased. This is because contact hole has to be formed having width W between 1 μm and 1.5 μm.

In detail, as shown in FIG. 1, the contact area between the p- electrode metal layer 17 and the p- InGaAsP layer 13 is seriously reduced and thus ohmic contact resistance is further increased. Increase in the threshold current of oscillation therein causes due to lowering in the voltage to be applied to p- n junction thereof. As a result, such a semiconductor laser device is increased in heat generation and thus is lowered in average life span thereof. Accordingly, the studies have been developed for methods for manufacturing a semiconductor laser device in which a ridge is further short in width and a contact hole is as long as possible in width thereof.

In order to overcome the above mentioned problems, U.S. Pat. No. 4,830,986 discloses another conventional method for manufacturing the semiconductor laser device as shown in FIGS. 2A and 2B. The method for manufacturing the laser device as shown in FIGS. 2A and 2B has the same method for manufacturing the laser device as shown in FIG. 1 except that a patterned photoresist 26 is used as an etching mask so as to form a ridge on a substrate 21. For example, processing steps for sequentially forming several films 22, 23, 24, and 25 on the substrate 21, as shown in FIG. 2A, are similar to the processing steps for sequentially forming the films 12, 13, 14, and 15 on the substrate 11, as shown in FIG. 1.

As shown in FIG. 2A, in case of forming of a ridge by an under-cut etching method, etching is not performed only in the direction perpendicular to the upper surface of the substrate 21 and is performed in overall directions under the patterned photoresist 26. Then, a dielectric layer 27, as made of $SiO_2$, is deposited, in the arrow directions A, B, and C as shown in FIG. 2, on the patterned photoresist 26 and the p- InGaAsP layer 23 as well as both side walls of the ridge, using an E-beam deposition as well-known in the art.

If the dielectric material is not formed on a portion of any one of the both side walls, a leak current is largely increased. Accordingly, the depositing process of the dielectric layer 27 has to be completely performed to prevent occurrence of a leakage current therein.

Subsequently, after deposition of the dielectric layer 27, the patterned photoresist 26 is removed by acetone solution as etching solution, and then the dielectric layer on the ridge also is removed. This process is called "lift-off". Finally, a p- electrode metal layer 28 is coated on the dielectric layer 27 and the upper surface of the ridge, and an n- electrode metal layer 29 is coated on the bottom surface of the substrate 21. As a result, the semiconductor laser device having the construction of FIG. 2B is completely manufactured.

Since the semiconductor laser device which is manufactured by the above described method is relatively wide in ohmic contact area, as compared to that of FIG. 1, the ridge can be formed having a relatively short width. As a result, such a semiconductor laser device can be largely reduced in lowering of operating characteristic thereof.

However, since the E-beam deposition is used for formation of the dielectric layer in this method, it is difficult to form dielectric material on both side walls of the ridge. Particularly, interface characteristic between semiconductor layer and the dielectric layer formed by the E-beam deposition is not good, and thus a leak current is generated therebetween.

SUMMARY OF THE INVENTION

It is the object of the present invention to provide a method for manufacturing the semiconductor laser device of an RWG type so as to prevent a leakage current from being caused in interface between a semiconductor layer and a dielectric layer and to largely improve operating characteristics of the laser device.

In order to achieve the object, the semiconductor laser device of a ridge waveguide type according to an aspect of the present invention comprises an active layer formed on an InP substrate; a first photo-waveguide layer formed on the active layer; a ridge comprised of a cladding layer having a predetermined pattern and an ohmic contact layer formed on the patterned cladding layer, said ohmic contact layer having an impurity injecting portion formed by diffusion of impurity ions of high concentration; a p- electrode metal layer formed only on the ridge; an dielectric layer deposited on the substrate formed thus, said dielectric layer having a contact hole formed only on the ridge; and a p- bonding pad metal layer coated on the dielectric layer and in the contact hole; wherein width of said contact hole is less narrower than that of the ridge.

In this construction, the laser device further comprises a second photo-waveguide layer formed between the substrate and the active layer. Also, the laser device further comprises a grating formed in one of the first and second photo-waveguide layers.

In addition, the ridge is made of a channel type, said active layer is formed of a quantum well structure, and said active layer is formed of a quantum well structure having strain.

According to another aspect of the present invention, the method for manufacturing the semiconductor laser device comprising the steps of sequentially forming an active layer, a photo-waveguide layer, a cladding layer, and an ohmic contact layer on an upper surface of an InP substrate; forming a first patterned dielectric layer on the ohmic contact layer; depositing a patterned photoresist on the ohmic contact layer to define a p- electrode stripe layer; forming the p- electrode stripe layer only on a part of the ohmic contact layer; performing an annealing process; etching back the layers until the photo-waveguide layer is exposed, using the first patterned dielectric layer and the p- electrode stripe layer as an etching mask, to form a ridge; depositing a second dielectric layer on the substrate formed thus; selectively removing the second dielectric layer to form a contact hole on the p- electrode stripe layer; coating a bonding pad metal layer on the second dielectric layer and in the contact hole; and coating an n- electrode metal layer on bottom surface of the substrate.

Also, the method further comprises the step of injecting impurity ions into the ohmic contact layer, using the first patterned dielectric layer as a mask, to form an impurity injected portion in the ohmic contact layer. The method further comprises the step of removing the first patterned dielectric layer.

In this method, the electrode stripe layer is formed by a lift-off process, the contact hole is formed by a selectively chemical-etching process, and the ridge is formed by a dry etching process.

BRIEF DESCRIPTION OF THE DRAWINGS

This invention may be better understood and its object will become apparent to those skilled in the art by reference to the accompanying drawings as follows.

DESCRIPTION OF THE PREFERRED EMBODIMENT(S)

Figure 1:
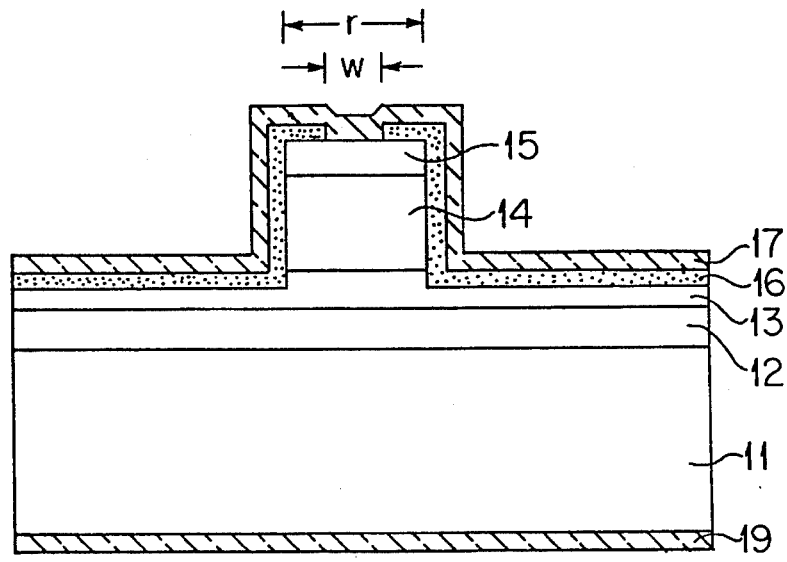
FIG. 1 is a cross-sectional view showing a semiconductor laser device which is manufactured by a conventional fabrication method.
Figure 2A:
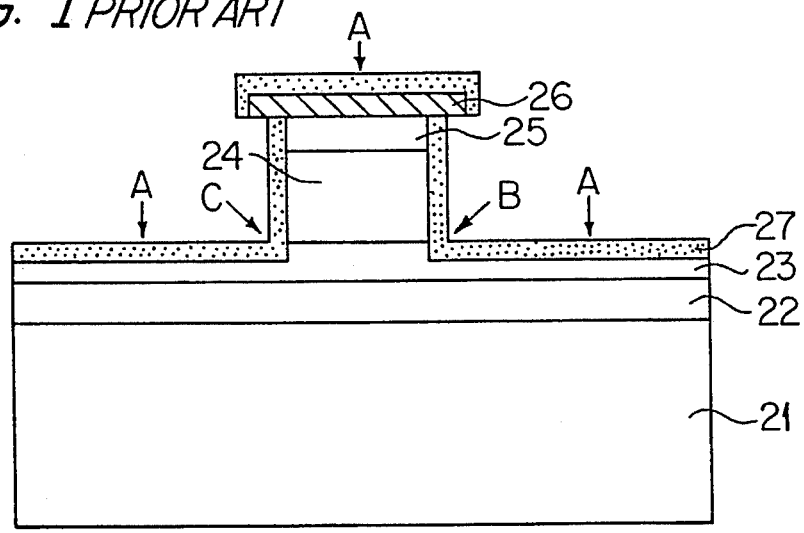
FIGS. 2A and 2B are cross-sectional views showing steps for manufacturing a semiconductor laser device according to another conventional fabrication method.
Figure 2B:
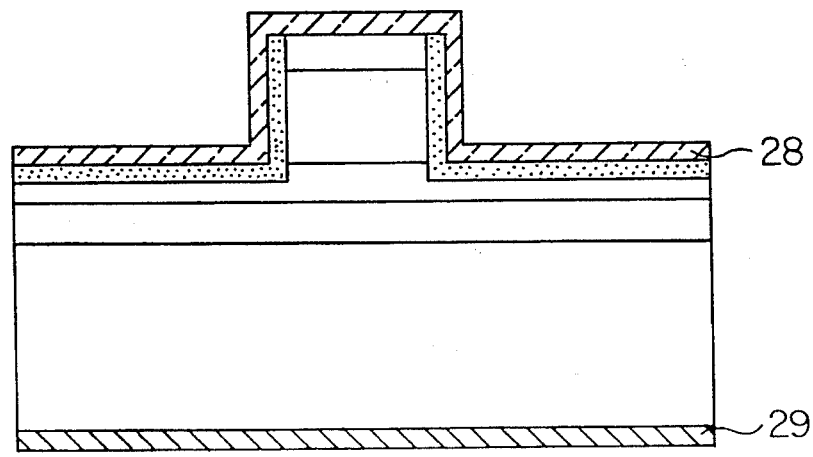
Figure 3A:
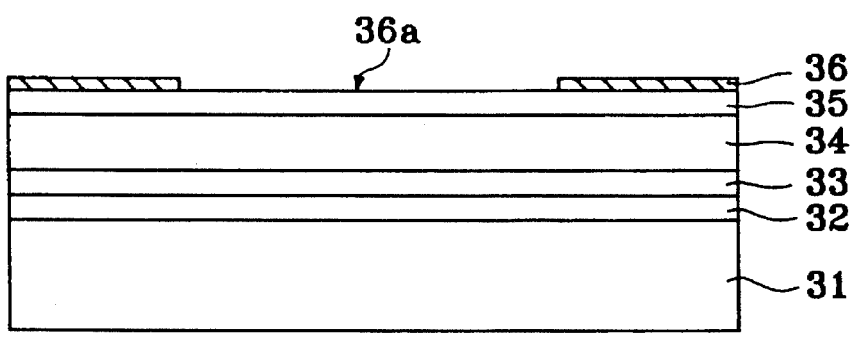
FIGS. 3A to 3H are cross-sectional views showing the steps of manufacturing a semiconductor laser device according to the present invention.

Referring to FIG. 3A, on an n- InP substrate S1 is formed an epitaxial layer, and then on this epitaxial layer is deposited a dielectric layer 35 having a predetermined pattern. The epitaxial layer is formed of several films 32, 33, 34, and 35 by LPE (liquid phase epitaxy) or MOCVD (metal-organic chemical vapor deposition).

In this embodiment, as shown in FIG. 3A, on the substrate 31 is formed an InGaAsP film 32 which is approximately 0.2 μm in thickness and about 0.95 eV in bandgap composition to form an active film. Next, on the active film 32 is formed a p- InGaAsP film 33 which is approximately 0.2 μm in thickness and about 1.12 eV in bandgap composition to form a photo-waveguide film, and on the photo-waveguide film 33 is formed a p- InP film 34 which is approximately 1.5 to 2 μm in thickness to form a cladding film. Subsequently, on the cladding film is formed a P$^+$InGaAs film 35 which is approximately 0.3 to 0.5 μm in thickness to form an ohmic contact film. As a result, the epitaxial layer having the several films is formed on the substrate 31. Also, in this embodiment, the dielectric layer 36 formed on the epitaxial layer is made of $Si_3N_4$ or SiO2 by CVD (chemical vapor deposition). The dielectric layer 36 is patterned by a photolithography so as to form a stripe window 36a having about 10 to 40 μm in width.

Figure 3B:
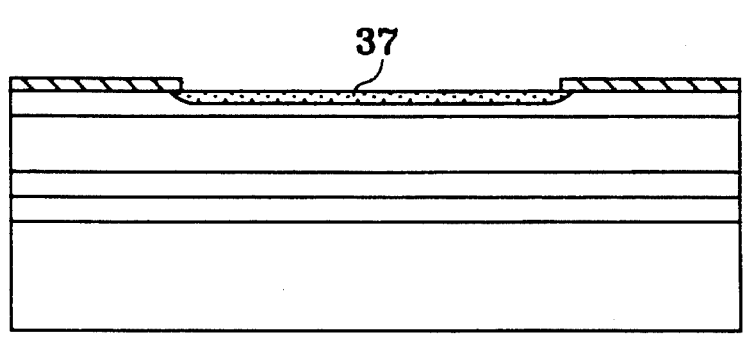

In FIG. 3B, in order to reduce ohmic contact resistance, an impurity is injected into the ohmic contact film 35 through the stripe window 36a using the patterned dielectric layer 36 as a mask, so that an impurity injected portion 37 can be formed in the ohmic contact film 35. In this embodiment, the impurity injected portion 37 is doped or implanted with zinc ions to have high impurity concentration.

Figure 3C:
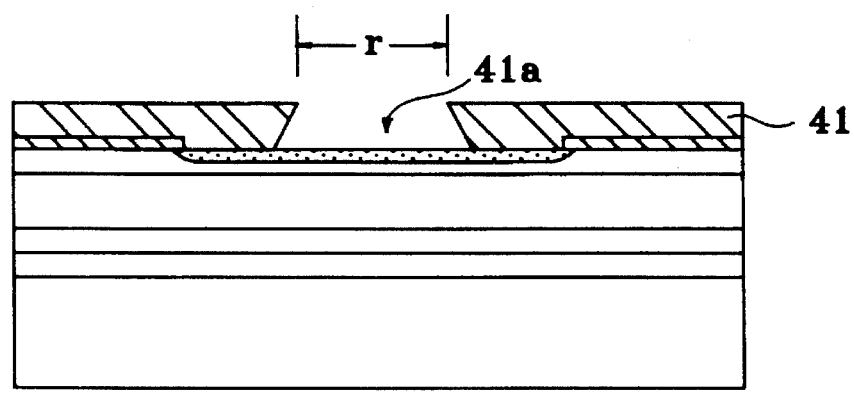

With respect to FIG. 3C, a photoresist 41 is deposited on the dielectric layer 36 and the exposed portion 37 and patterned by the photolithography to form a ridge window 41a having a predetermined width r.

Figure 3D:
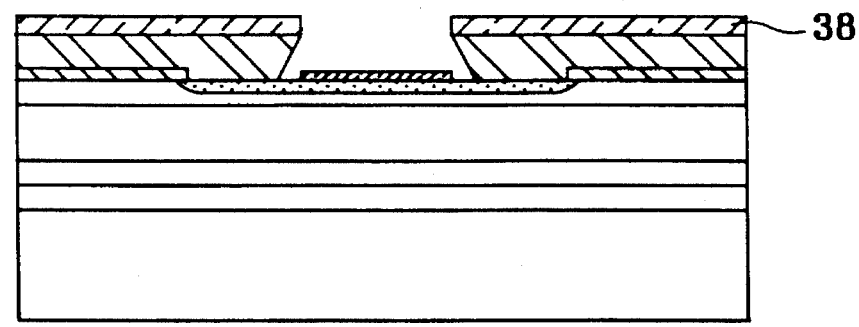

Also, as shown in FIG. 3D, a p- electrode metal layer 38 is formed on the patterned photoresist layer 41 and one portion of the impurity injected portion 37, which is corresponding to the ridge window 41a, using the patterned photoresist 41 as a mask. The lift-off method is well known as one of fabrication techniques of a compound semiconductor device, and is widely used in forming of electrode metal patterns of a photodiode or a transistor.

Figure 3E:
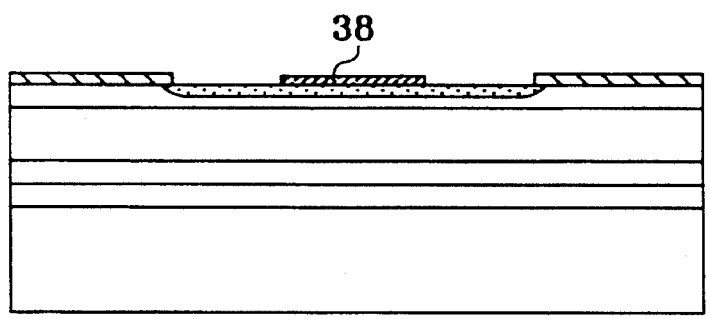

Next, the patterned photoresist layer 41 and the metal layer 38 thereon are removed by an etching method, as shown in FIG. 3E, and then an annealing process is performed to improve the characteristic of an ohmic contact resistance.

Figure 3F:
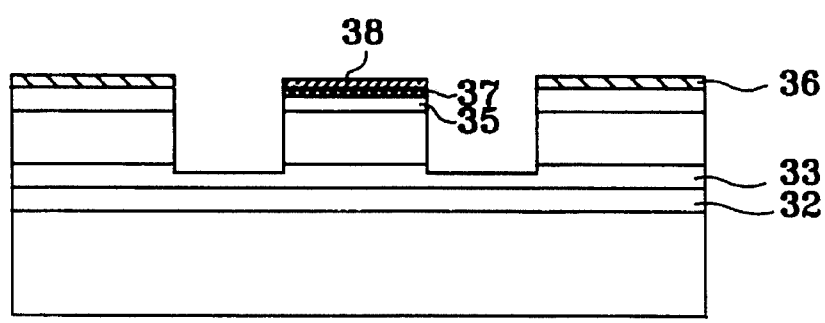

Using the dielectric layer 36 and the remaining electrode metal layer 38 as a ridge forming mask, an etching process is performed until the photo-waveguide layer 33 is exposed and further removed to some extend in depth, and thus a ridge is formed as shown in FIG. 3F. A selectively etching method can be used as the etching process, or ion beam etching method or a dry-etching method can be used.

Figure 3G:
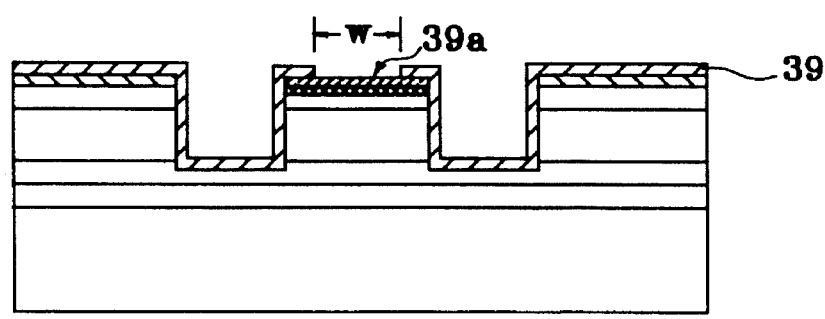

In FIG. 3G, a second dielectric layer 39 made of SiO$_2$ or Si$_3$N$_4$ is formed on the substrate formed thus, using CVD, sputtering, E-beam deposition method or the like, and which has approximately 0.2 μm in thickness.

In addition, a contact hole 39a is formed only on a portion of the electrode metal layer 38 by the photolithography, as shown in FIG. 3G, so as to connect the electrode metal layer 38 and a bonding pad metal layer to be formed by the following process. In this embodiment, the width W of the contact hole 39a is set less than that of the electrode metal layer 38. Then, even through the width W of the contact hole 39a is formed having about 1 μm or less so as to perform mask adjusting process and the like easily, reduction in the width of the contact hole 39a has no effect on any of laser characteristics, such as an ohmic contact resistance or the like. As a result, such a mask adjusting process can be performed easily.

Figure 3H:
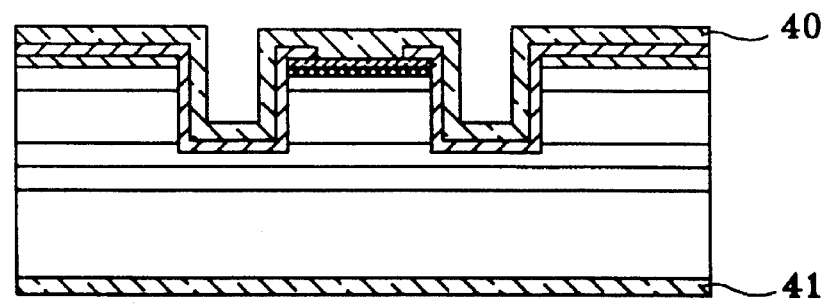

Subsequently, as shown in FIG. 3H, on the substrate formed thus is coated a bonding pad metal layer 40, and then in order to make cleaving of a laser easily the bottom surface of the substrate 31 is grounded until the substrate 31 has approximately 100 μm in thickness. Finally, on the bottom surface of the grounded substrate is coated an n- electrode metal layer 41.

Figure 4:
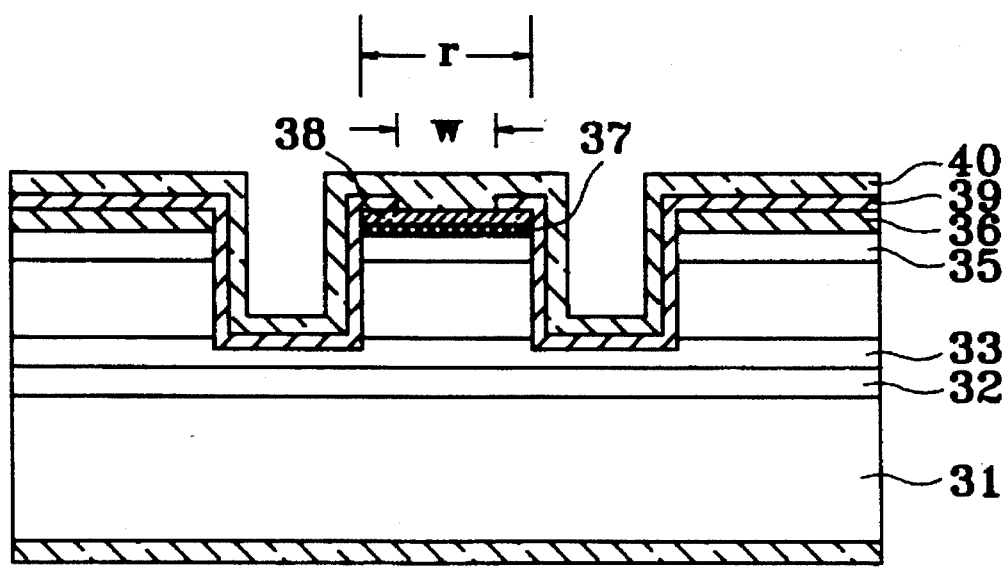
FIG. 4 is a cross-sectional view showing the construction of the semiconductor laser device which is manufactured by the method of the present invention.

FIG. 4 is an enlarged cross-sectional view of the semiconductor laser device which is manufactured by the steps in accordance with embodiment of the present invention.

In FIG. 4, the laser device of the present invention has the construction in which on the n- InP substrate 31 are formed the InGaAsP active film 32 having 0.95 eV in a bandgap composition and 0.2 μm in thickness, the p- InGaAsP photo-waveguide film 33 having 1.12 eV bandgap composition and 0.2 μm thickness, the p- InP cladding film 34 having 1.5 to 2 μm thickness, the P$^+$ InGaAs ohmic contact film 35 having 0.3 to 0.5 μm thickness, in order., to form the epitaxial layer on the substrate 31, then over the substrate 31 is formed the ridge using the method similar to a conventional method, only on the ridge is formed the p- electrode layer 38, and on the substrate having the ridge are sequentially formed the dielectric layer 39 having the contact hole 39a and the bonding pad metal layer 40.

In this construction, since the p- electrode layer 38 is widely contacted with the P$^+$ InGaAs ohmic contact film 35 through the impurity injected portion 37, ohmic contact resistance is largely lowered as compared to that of the convention laser device. Also, since width of the ridge is equal to width of the ohmic contact area, the width of the ridge can be formed with 3 μm or less.

In the case that the construction of the semiconductor laser device according to the present invention is applied to single-wavelength semiconductor laser device, such as DFB (distributed feedback), DBR (distributed brag reflector) or the like, in which grating is formed in the photo-waveguide layer 33, further good effects can be obtained.

Figure 5:
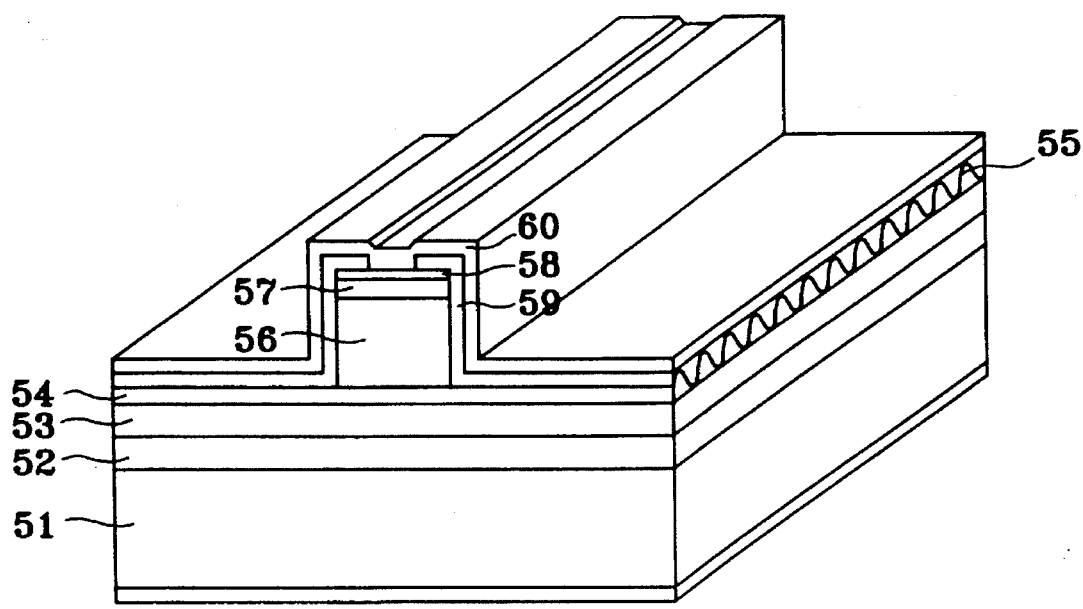
FIG. 5 is a cross-sectional view showing the construction of the single-wavelength semiconductor laser device to which the construction of the semiconductor laser device according to the present invention is applied.

For example, FIG. 5 shows a part of RWG-DFB semiconductor laser device. In FIG. 5, the RWG-DFB semiconductor laser device has the construction in which on an n- InP substrate 51 are sequentially formed an InGaAsP photo-waveguide film 52 having 0.95 eV in a bandgap composition and 0.2 μm in thickness, an InGaAsP active film 53 having 0.8 eV bandgap composition and 0.2 μm thickness, and a p- InGaAsP photo-waveguide film 54 having 0.95 eV and 0.2 μm to form a first epitaxial layer on the substrate 51, in the p- InGaAsP photo-waveguide film 54 is formed a grating 55, and on the p- InGaAsP photo-waveguide film 54 are sequentially formed a p- InP cladding film 56 and a P$^+$ InGaAs ohmic contact film 57 having an impurity injected portion 58 thereon to form a second epitaxial layer for forming a ridge.

In this construction, the InGaAsP active film 53 can be substituted for an InGaAs/InP quantum well structure layer. In FIG. 5, reference numerals 59 and 60 indicate an dielectric layer having a contact hole and an bonding pad metal layer formed thereon, respectively. The effects similar to the above mentioned effects can be obtained.

In the semiconductor laser device according to the present invention, since ohmic contact resistance can be lowered by forming the impurity injected portion in the ohmic contact layer and performing the annealing process, thermal generation and threshold current of oscillation are decreased. As a result, operating characteristics of the laser device can be largely improved.

Also, width of the ridge of the laser device can be formed smaller than that of the ridge of the conventional laser device, and thus partial photon or electron-hole density is restricted within spatially narrow area, so that threshold current of oscillation therein can be reduced and modulating speed therein can be increased.

Further, the laser device of the present invention can be manufactured by well-known semiconductor fabrication techniques, and align tolerance is high when mask alignment is performed, as compared to those of the conventional laser device. As a result, the laser device of the present invention can be manufactured easily and can be mass-produced.

In addition, since annealing process is performed after formation of the p- electrode stripe, interface characteristic between the dielectric layer and the semiconductor layer can be improved. In such a single-wavelength semiconductor laser device used widely for a long-distance, high-speed optical fiber communication, it is necessary to reduce ohmic contact resistance and threshold current of oscillation. This is because heat generated during operating of the device may be effect on operating wavelength of the device. Accordingly, since the laser device of the present invention has further good characteristics in both of ohmic contact resistance and threshold current of oscillation to thereby be applied to such a single-wavelength semiconductor laser device.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for manufacturing a semiconductor laser device comprising the steps of:

sequentially forming an active layer, a photo-waveguide layer, a cladding layer, and an ohmic contact layer on an upper surface of an InP substrate to form an epitaxial layer;

forming a first patterned dielectric layer on the epitaxial layer;

depositing a patterned photoresist on the epitaxial layer to define a p- electrode stripe layer;

forming the p- electrode stripe layer only on a part of the epitaxial layer;

performing an annealing process;

etching back the layers until the photo-waveguide layer is exposed and removed to some extent, using the first patterned dielectric layer and the p- electrode stripe layer as an etching mask, to form a ridge;

depositing a second dielectric layer on the epitaxial layer;

selectively removing the second dielectric layer to form a contact hole on a portion of the p- electrode stripe layer;

coating a bonding pad metal layer on the second dielectric layer and in the contact hole; and coating an n- electrode metal layer on bottom surface of the substrate.

2. The method according to claim 1, further comprising the step of injecting impurity ions into the ohmic contact layer, using the first patterned dielectric layer as a mask, to form an impurity injected portion in the ohmic contact layer.

3. The method according to claim 1 further comprising the step of removing the first patterned dielectric layer.

4. The method according to claim 1, wherein the electrode stripe layer is formed by a lift-off process.

5. The method according to claim 1, the contact hole is formed by a selectively chemical-etching process.

6. The method according to claim 1, the ridge is formed by a dry etching process.

* * * * *